(12) United States Patent
Ieong et al.

(10) Patent No.: US 8,373,637 B2
(45) Date of Patent: Feb. 12, 2013

(54) SHIFT REGISTER AND LIQUID CRYSTAL DISPLAY USING SAME

(75) Inventors: Man-Fai Ieong, Miao-Li (TW); Sz-Hsiao Chen, Miao-Li (TW)

(73) Assignee: Chimei Innolux Corporation, Miaoli County (TW)

( * ) Notice: Subject to any disclaimer, the term of this patent is extended or adjusted under 35 U.S.C. 154(b) by 1325 days.

(21) Appl. No.: 12/150,380

(22) Filed: Apr. 28, 2008

(65) Prior Publication Data
US 2008/0266234 A1    Oct. 30, 2008

(30) Foreign Application Priority Data
Apr. 27, 2007  (CN) .......................... 2007 1 0074230

(51) Int. Cl.
*G09G 3/36* (2006.01)

(52) U.S. Cl. ............ 345/100; 345/87; 345/99; 345/204; 377/64

(58) Field of Classification Search ............ 345/99–100, 345/76, 87, 204; 377/64
See application file for complete search history.

(56) References Cited

U.S. PATENT DOCUMENTS

| | | | | |
|---|---|---|---|---|
| 6,885,723 B2* | 4/2005 | Yu | .................................... | 377/78 |
| 6,970,530 B1* | 11/2005 | Wang et al. | ...................... | 377/69 |
| 7,027,550 B2 | 4/2006 | Lin | | |
| 2004/0217935 A1* | 11/2004 | Jeon et al. | ...................... | 345/100 |
| 2005/0008114 A1* | 1/2005 | Moon | .............................. | 377/64 |
| 2005/0031068 A1* | 2/2005 | Chan et al. | ....................... | 377/64 |
| 2005/0036581 A1* | 2/2005 | Lin | .................................. | 377/54 |
| 2008/0101529 A1* | 5/2008 | Tobita | .............................. | 377/64 |

* cited by examiner

*Primary Examiner* — Viet Pham
(74) *Attorney, Agent, or Firm* — WPAT, PC; Justin King

(57) ABSTRACT

An exemplary shift register includes plural shift register units (S1~Sn). All the shift register units receive either a first clock signal or a second clock signal, and the shift register units output a plurality of shift register signals in sequence. An output of a previous shift register unit is an input of the next adjacent shift register unit.

14 Claims, 5 Drawing Sheets

SHIFT REGISTER AND LIQUID CRYSTAL DISPLAY USING SAME

FIELD OF THE INVENTION

This invention relates to a shift register typically used in a driving circuit of a liquid crystal display (LCD), with the shift register being used to provide shift register signals that do not overlap each other.

GENERAL BACKGROUND

Shift registers are core circuit units of driving circuits that are used in products such as thin film transistor liquid crystal displays (TFT-LCDs). A shift register provides sequential pulse signals to scanning lines of a TFT LCD, so as to switch on or switch off TFTs connected to the corresponding scanning lines. Generally, a shift register includes a plurality of shift register units.

Referring to FIG. 5, this is a circuit diagram of a shift register unit 100 of a typical shift register. The shift register unit 100 includes a first clock inversion circuit 110, an inverter 120, and a second clock inversion circuit 130. All transistors in the first clock inversion circuit 110, the inverter 120, and the second clock inversion circuit 130 are PMOS (P-channel metal oxide semiconductor) transistors. The first clock inversion circuit 110 receives a signal VS output from a pre-stage shift register unit (not shown). The signal VS functions as a start signal of the shift register unit 100.

The first clock inversion circuit 110 includes a first transistor M1, a second transistor M2, a third transistor M3, a fourth transistor M4, a first output VO1, and a second output VO2. The first transistor M1 includes a gate for receiving the start signal VS, a source coupled to a first voltage (VDD) such as a power voltage, and a drain coupled to a source of the second transistor M2. The second transistor M2 includes a gate and a drain both coupled to a second voltage (VSS) such as a grounding voltage. The third transistor M3 includes a source coupled to the source of the second transistor M2, a drain serving as the first output VO1, and a gate coupled to a gate of the fourth transistor M4. The gates of the third and fourth transistors M3 and M4 cooperatively serve as a first control terminal to receive a clock signal $\overline{TS}$. The fourth transistor M4 includes a source coupled to the start signal VS, and a drain serving as the second output VO2.

The inverter 120 includes a fifth transistor M5 and a sixth transistor M6. The inverter 120 outputs an output signal that serves as the shift register signal VO. The fifth transistor M5 includes a source coupled to the first voltage VDD, a gate coupled to the drain of the third transistor M3, and a drain coupled to a source of the sixth transistor M6. The drain of the fifth transistor M5 and the source of the sixth transistor M6 serve as an output for outputting the shift register signal VO. The sixth transistor M6 further includes a gate coupled to the drain of the fourth transistor M4, and a drain coupled to the second voltage VSS.

The second clock inversion circuit 130 and the first clock inversion circuit 120 have similar structures. The second clock inversion circuit 130 includes a seventh transistor M7, an eighth transistor M8, a ninth transistor M9, and a tenth transistor M10. The seventh transistor M7 includes a gate for receiving the shift register signal VO from the inverter 12, a source coupled to the first voltage VDD, and a drain coupled to a source of the eighth transistor M8. The eighth transistor M8 further includes a gate and a drain coupled to the second voltage VSS. The ninth transistor M9 includes a source coupled to the source of the eighth transistor M8, a gate coupled to a gate of the tenth transistor M10, and a drain coupled to the gate of the fifth transistor M5. The gates of the ninth and tenth transistors M9 and M10 cooperatively serve as a second control terminal for receiving an inverse clock signal TS. The tenth transistor M10 further includes a source coupled to the gate of the seventh transistor M7 and the shift register signal VO of the inverter 120, and a drain coupled to the gate of the sixth transistor M6 via the second output VO2.

Referring to FIG. 6, this is a sequence waveform diagram of pulse signals of the shift register unit 100. During period t1, the third and fourth transistors M3 and M4 are switched off and the ninth and tenth transistors M9 and M10 are switched on because the start signal VS jumps to a low voltage and the clock signal $\overline{TS}$ jumps to a high voltage. Thus, the inverter 120 and the second clock inversion circuit 130 perform a latch operation. The sixth transistor M6 is switched off such that the shift register signal VO of the inverter 120 keeps an original state of the previous stage.

During period t2, the third and fourth transistors M3 and M4 are switched on and the ninth and tenth transistors M9 and M10 are switched off because the clock signal $\overline{TS}$ jumps to a low voltage and the inverse clock signal TS jumps to a high voltage. Thus, there is no latch operation. The start signal VS is applied to the inverter 120, and the inverter 120 and the second clock inversion circuit 130 keep the same state. Further, the first transistor M1 is switched on because the start signal VS jumps to a low voltage, such that the fifth transistor M5 is switched off and the sixth transistor M6 is switched on. Thus, the inverter 120 outputs the shift register signal VO having a low level through the activated sixth transistor M6.

During period t3, the third and fourth transistors M3 and M4 are switched off and the ninth and tenth transistors M9 and M10 are switched on because the clock signal $\overline{TS}$ jumps to a high voltage and the inverse clock signal TS jumps to a low voltage. Therefore the inverter 120 and the second clock inversion circuit 130 perform a latch operation. Thus, the shift register signal VO of the inverter 120 keeps the original state of period t2. The seventh transistor M7 is switched on by the shift register signal VO from the inverter 120, such that the transistor M5 is still off. In addition, the sixth transistor M6 maintains an on-state because the shift register signal VO is low level. Thus, the inverter 120 maintains output of the low level shift register signal VO through the activated sixth transistor M6.

During period t4, the third and fourth transistors M3 and M4 are switched on and the ninth and tenth transistors M9 and M10 are switched off because the clock signal $\overline{TS}$ jumps to a low voltage and the inverse clock signal TS jumps to a high voltage. Thus, there is no latch operation. The start signal VS is applied to the inverter 120. The inverter 120 and the second clock inversion circuit 130 keep the same state. The sixth and first transistors M6 and M1 are switched off and the fifth transistor M5 is switched on because the start signal VS is high level. Thus, the inverter 120 stops output of the low-level shift register signal VO.

The shift register unit 100 outputs a low level shift register signal during period t2, and at the same time, the next-stage shift register unit (not shown) also outputs a low level shift register signal. Thus, the adjacent shift register units may cause a conflict of signal outputting due to the overlapping of the adjacent shift register signals. As a result, the shift register is liable to be unstable. Accordingly, an LCD device using the shift register may have impaired display quality because adjacent scanning lines may be scanned simultaneously by the overlapping shift register signals instead of being scanned sequentially.

What is needed, therefore, is a shift register which can overcome the above-described deficiencies. What is also needed is an LCD including the shift register.

SUMMARY

An exemplary shift register includes a plurality of shift register units. Each shift register unit is provided with on of a first clock signal and a second clock signal, a high-level voltage, a low-level voltage. Each two adjacent shift register units receive the first and second clock signal respectively. Each shift register unit includes a signal outputting circuit, a level unit, a signal inputting circuit, a first inversion circuit, and a second inversion circuit. The signal outputting circuit includes a clock unit having a first output, the clock unit being configured for receiving one of the first and second clock signals from an external circuit and applying the shift register signal to the first output, and a level unit configured for receiving and applying the low-level voltage to the first output. The signal inputting circuit is configured for switching on the clock unit upon condition of receiving a shift register signal from the previous shift register unit, and switching off the clock unit upon receiving a shift register signal from the next shift register unit. The first inversion circuit configured for switching off the level unit when the clock unit is switched on. The second inversion circuit configured for switching on the level unit upon receiving the shift register signal of the next shift register unit. When the clock unit is switched on, the signal outputting circuit outputs the shift register signal, and when the clock unit is switched off, the level unit is switched on by the second inversion circuit, and the signal outputting circuit outputs a low-level signal.

Other novel features and advantages will become more apparent from the following detailed description when taken in conjunction with the accompanying drawings.

DETAILED DESCRIPTION OF PREFERRED EMBODIMENTS

Figure 1:
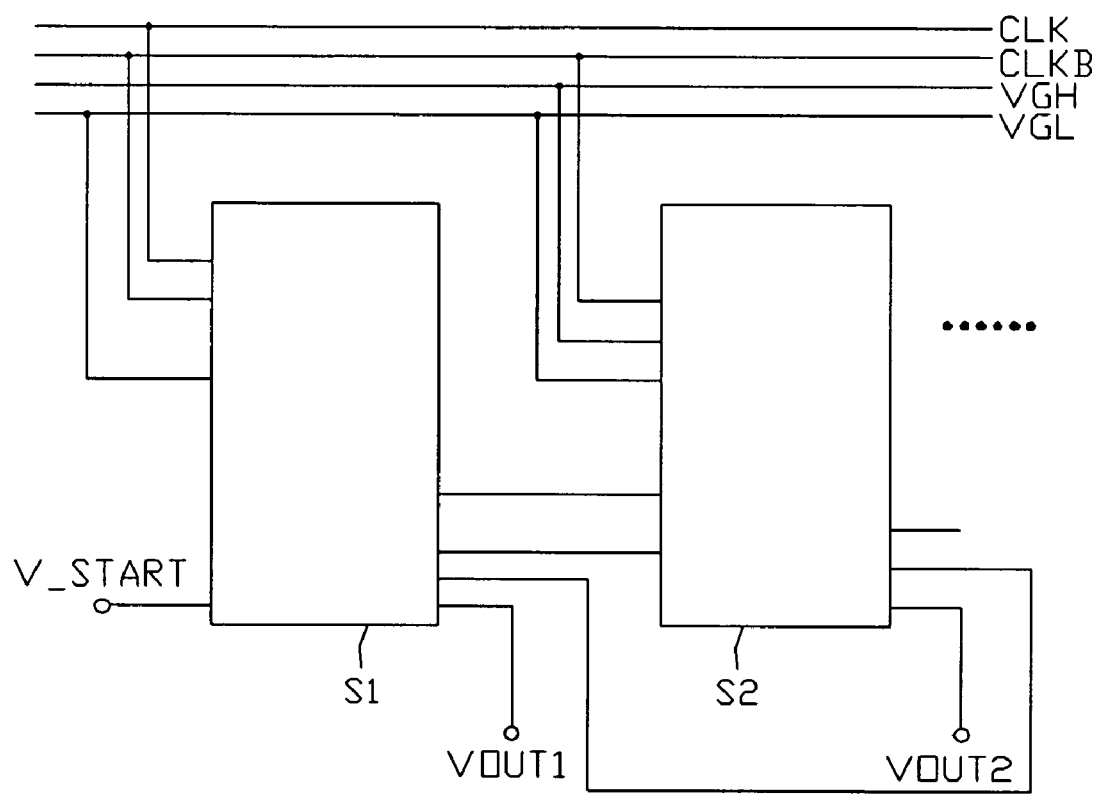
FIG. 1 is an abbreviated circuit diagram of a shift register according to an exemplary embodiment of the present invention, the shift register including a plurality of shift register units.
Figure 2:
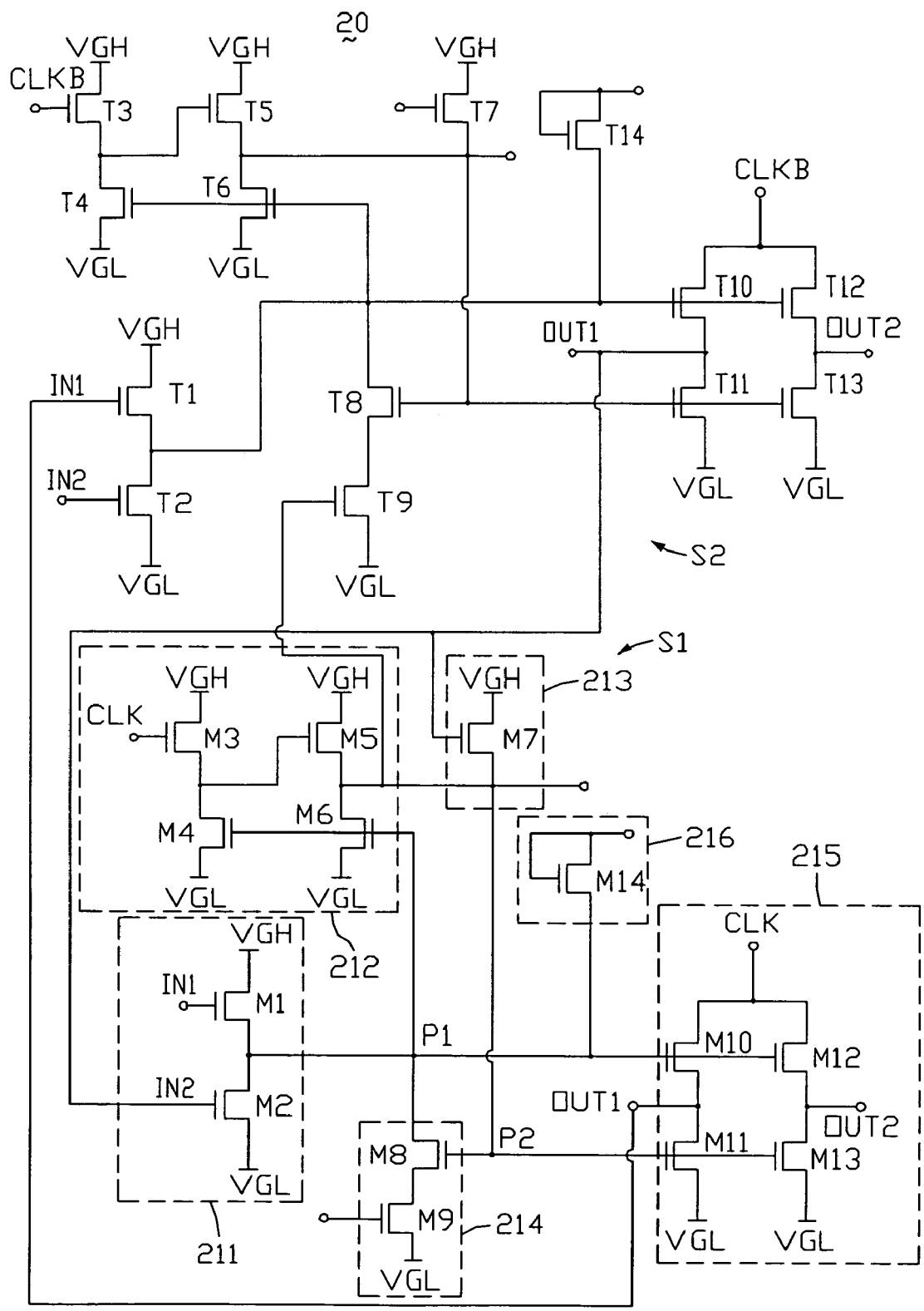
FIG. 2 is a circuit diagram of a first one and a second one of the shift register units of FIG. 1.

Referring to FIGS. 1 and 2, a shift register 20 according to an exemplary embodiment of the present invention includes a plurality of shift register units S1~Sn (where n is a natural number). Only the first shift register unit S1 and the second shift register unit S2 are shown in FIGS. 1 and 2. The shift register units S1~Sn each include a plurality of N-channel metal oxide semiconductor (NMOS) transistors. The shift register units S1~Sn each have the same circuit structure, and are provided with a high-level voltage VGH, a low-level voltage VGL, and one of a first clock signal CLK and a second clock signal CLKB. The first and second clock signals CLK and CLKB are identical in amplitude, duty ratio, and frequency, but are inverse in phase relative to each other. A duty ratio of the first and second clock signals CLK and CLKB can be 50%. It should be noted that the first shift register unit S1 and other odd-numbered shift register units S3, S5, . . . have the first clock signal CLK applied thereto. The second shift register unit S2 and other even-numbered shift register units S4, S6, . . . have the second clock signal CLKB applied thereto. Each of the shift register units S1~Sn includes a first input IN1, a second input IN2, a first output OUT1 and a second output OUT2. The second outputs OUT2 of the plural shift register units S1~Sn are configured for sequentially outputting a plurality of shift register signals VOUT~VOUTn respectively.

In the following description, unless the context indicates otherwise, a reference to a high level means the high-level voltage VGH, and a reference to a low level means the low-level voltage VGL.

The first shift register unit S1 includes a signal inputting circuit 211, a first inversion circuit 212, a second inversion circuit 213, a third inversion circuit 214, a signal outputting circuit 215, and a testing circuit 216. The signal inputting circuit 211, the first inversion circuit 212, the third inversion circuit 214, and the signal outputting circuit 215 have a first common node P1 (see FIG. 2). The second inversion circuit 213, the third inversion circuit 214, and the signal outputting circuit 215 have a second common node P2 (see also FIG. 2).

The first shift register unit S1 is now described in detail as follows. The signal inputting circuit 211 includes a first transistor M1 and a second transistor M2. A gate of the first transistor M1 has a start signal V-START applied thereto, a source of the first transistor M1 has the high-level voltage VGH applied thereto, and a drain of the first transistor M1 is connected to the first common node P1. A gate of the second transistor M2 is connected to the second shift register unit 22, a source of the second transistor M2 is connected to the first common node P1, and a drain of the second transistor M2 has the low-level voltage VGL applied thereto. Furthermore, the gate of the first transistor M1 is connected to the first input IN1, and the gate of the second transistor M2 is connected to the second input IN2.

The first inversion circuit 212 includes a third transistor M3, a fourth transistor M4, a fifth transistor M5, and a sixth transistor M6. A gate of the third transistor M3 has the first clock signal CLK applied thereto, a drain of the third transistor M3 has the high-level voltage VGH applied thereto, and a source of the third transistor M3 is connected to a drain of the fourth transistor M4. A gate of the fourth transistor M4 is connected to the first common node P1, and a drain of the fourth transistor M4 has the low-level voltage VGL applied thereto. A gate of the fifth transistor M5 is connected to the source of the third transistor M3, a source of the fifth transistor M5 is connected to a drain of the sixth transistor M6, and a drain of the fifth transistor M5 has the high-level voltage VGH applied thereto. A gate of the sixth transistor M6 is connected to the first common node P1, and a source of the sixth transistor M6 has the low-level voltage VGL applied thereto.

The second inversion circuit 213 includes a seventh transistor M7. A gate of the seventh transistor M7 is connected to the gate of the second transistor M2, a source of the seventh transistor M7 is connected to the second common node P2, and a drain of the seventh transistor M7 has the high-level voltage VGH applied thereto.

The third inversion circuit 214 includes an eighth transistor M8 and a ninth transistor M9. A gate of the eighth transistor M8 is connected to the second common node P2, a source of the eighth transistor M8 is connected to a drain of the ninth transistor M9, and a drain of the eighth transistor M8 is connected to the first common node P1. A source of the ninth transistor M9 has the low-level voltage VGL applied thereto. A gate of the ninth transistor M9 is floating.

The signal outputting circuit 215 includes a tenth transistor M10, an eleventh transistor M11, a twelfth transistor M12, and a thirteenth transistor M13. Gates of the tenth transistor M10 and the twelfth transistor M12 are both connected to the first common node P1. A source of the tenth transistor M10 is connected to a source of the eleventh transistor M11. A source of the twelfth transistor M12 is connected to a source of the thirteenth transistor M13. Drains of the tenth transistor M10 and the twelfth transistor M12 both have the first clock signal CLK applied thereto. The tenth transistor M10 and the twelfth transistor M12 are defined as a clock unit, and the eleventh transistor M11 and the thirteenth transistor M13 are defined as a level unit. The source of the tenth transistor M10 is connected to the first output OUT1 of the first shift register unit S1, and the source of the twelfth transistor M12 is connected to the second output OUT2 of the first shift register unit S1.

The testing circuit 216 includes a fourteenth transistor M14. A gate of the fourteenth transistor M14 is connected to the gate of the second transistor M2, a source of the fourteenth transistor M14 has the high-level voltage VGH applied thereto, and a drain of the fourteenth transistor M14 is connected to the second common node P2.

The second shift register unit S2 has the same circuit structure as the first shift register unit S1. The second shift register unit S2 includes a plurality of transistors including first through fourteenth transistors T1~T14, which respectively correspond to the transistors M1~M14 of the first shift register unit S1. The transistors T1~T14 have the same connections as the transistors M1~M14. A source of the tenth transistor T10 is connected to the first output OUT1 of the second shift register unit S2. A source of the twelfth transistor T12 is connected to the second output OUT2 of the second shift register unit S2.

The first output OUT1 of the first shift register S1 is connected to a gate of the first transistor T1 of the second shift register S2. The first output OUT1 of the second shift register unit S2 is connected to the gate of the second transistor M2 of the first shift register unit S1, and is further connected to the gate of the seventh transistor M7 of the first shift register unit S1. A gate of the ninth transistor T9 of the second shift register unit S2 is connected to the source of the fifth transistor M5 of the first shift register unit S1 (and to the second common node P2).

Although only the first and second shift register units S1, S2 are described in detail herein, it should be noted that the first and second shift register units S1, S2 are exemplifications of two adjacent shift register units of the shift register 20. Every two adjacent shift register units may have the same connections therebetween as those of the first and second shift register units S1, S2.

Figure 3:
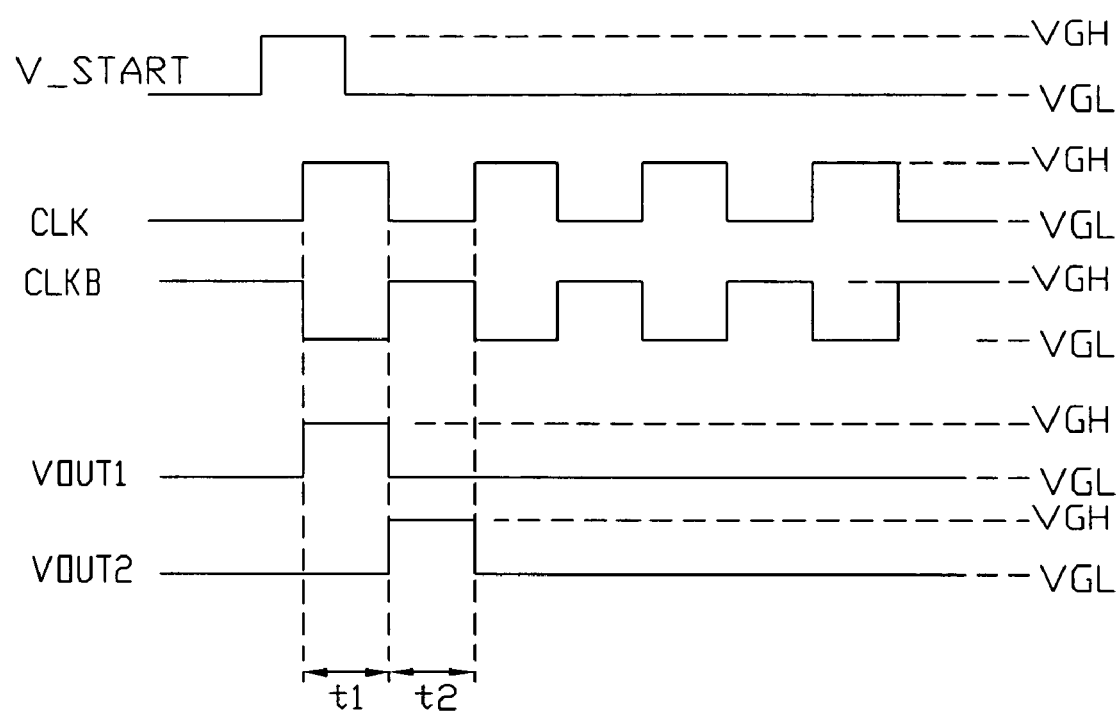
FIG. 3 is a timing chart related to driving signals of the shift register of FIG. 1.

Referring also to FIG. 3, a timing chart related to driving signals of the shift register 20 is shown.

Before the period t1, the first input IN1 of the first shift register unit S1 has a high-level signal V_START applied thereto. The first transistor M1 is switched on, and the high-level voltage VGH is applied to the first common node P1. Thus, the tenth transistor M10 and the twelfth transistor M12 are switched on. The sixth transistor M6 and the fourth transistor M4 are switched on. The low-level voltage VGL is applied to the drain of the third transistor M3 via the on-state fourth transistor M4, and further applied to the second common node P2 via the on-state sixth transistor M6.

During the period t1, the shift register 20 starts to work. The first clock signal CLK is high level, while the second clock signal CLKB is low level. The high-level clock signal CLK is applied to the first output OUT1 and the second output OUT2 via the on-state tenth transistor M10 and the on-state twelfth transistor M12. Furthermore, the third transistor M3 is switch on. The low-level voltage VGL is applied to the gate of the fifth transistor M5, thereby switching off the fifth transistor M5. The second common node P2 is maintained at low level. The signal outputting circuit 215 has the low-level voltage VGL applied thereto. Thus, the eleventh transistor M11 and the thirteenth transistor M13 are switched off to ensure that the first output OUT1 and the second output OUT2 are not affected by the low-level voltage VGL.

The second shift register unit S2 receives the low-level second clock signal CLKB. The first input IN1 of the second shift register unit S2 receives the high-level signal provided by the first output of the first shift register unit S1. The first transistor T1 is switched on. The tenth transistor T10 and twelfth transistor T12 are switched on. The third transistor T3 and the fifth transistor T5 are in off-states. The fourth and sixth transistors T4, T6 are switched on. Thus, the low-level voltage VGL is applied to the eleventh and thirteenth transistors T11, T13 such that the eleventh and thirteenth transistors T11, T13 are in off-states. The first output OUT1 of the second shift register unit S2 applies the low-level voltage to the second transistor M2 of the first shift register unit S1, thereby switching off the second transistor M2. The high-level signal V_START jumps to low level. The first common node P1 is maintained at high level.

During the period t2, the first clock signal CLK jumps to low level, and the second clock signal CLKB jumps to high level. The first common node P1 is maintained at high level. The tenth and twelfth transistors M10 and M12 are maintained in on-states. The first and second outputs OUT1, OUT2 of the first shift register unit S1 are at low level. The fourth and sixth transistors M4, M6 remain in on-states. The eleventh and thirteenth transistors M11, M13 are switched off.

The first and second outputs OUT1, OUT2 of the second shift register unit S2 output high level signals respectively. The third transistor T3 is switched on by the second clock signal CLKB. Because the fourth and sixth transistors T4 and T6 are in on-states, the eleventh and thirteenth transistors T11, T13 are switched off. Thus, the first and second outputs OUT1, OUT2 of the second shift register unit S2 are prevented from outputting rippling signals.

The high-level signal from the first output OUT1 of the second shift register unit S2 is applied to the gate of the second transistor M2 of the first shift register unit S1. The signal inputting circuit 211 applies a low-level signal to the first common node P1. The tenth and twelfth transistors M10, M12 are switched off. The high-level signal from the first output OUT1 of the second shift register unit S2 is also applied to the gate of the seventh transistor M7, and the seventh transistor M7 is thereby switched on. The eleventh and thirteenth transistors M11, M13 are switched on. Thus, the first and second outputs OUT1, OUT2 of the first shift register unit S1 output low-level signals.

After the period t2, the first input IN1 of the first shift register unit S1 remains at low level. The fourth, sixth, tenth, and twelfth transistors M4, M6, M10, and M12 remain in off-states. The eleventh and thirteenth transistors M11, M13 remain in on-states. The first and second outputs OUT1, OUT2 of the first shift register unit S1 remain at low level. Accordingly, the first and second outputs OUT1, OUT2 of the second shift register unit S2 remain at low level. The third inversion circuit 214 is configured as a reset circuit of the first shift register unit S1. The gates of the eighth and ninth transistors M8, M9 of the third inversion circuit 214 have reset signals applied thereto, which can reset the first shift register unit S1 to an original or a predetermined state.

The testing circuit 216 is configured for testing a liquid crystal display equipped with the shift register 20, and is dormant when the shift register unit 20 works normally.

In summary, during the period t1, when the tenth and twelfth transistors M10, M12 of the first shift register unit S1 are switched on, the high-level first clock signal CLK is applied to the first and second outputs OUT1, OUT2 of the first shift register unit S1, and the tenth and twelfth transistors T10, T12 of the second shift register unit S2 are switched on; thereby, the low-level second clock signal CLKB is applied to the first and second outputs OUT1, OUT2 of the second shift register unit S2. During the period t2, the first clock signal CLK jumps to low level and the second clock signal CLKB jumps to high level. The first and second outputs OUT1, OUT2 of the second shift register unit S2 output high-level signals, and the first and second outputs OUT1, OUT2 of the second shift register unit S2 are low level. In fact, the first output OUT1 and the second output OUT2 of each shift register unit output the same signals, namely the shift register signals. In addition, the shift register signal of the previous shift register unit is the input of the adjacent next shift register unit, and the shift register signal of the adjacent next shift register unit is also applied to the previous shift register unit as a feedback. Thus, the shift register 20 generates the shift register signals for outputting, with the shift register signals not overlapping.

Furthermore, when the first clock signal CLK jumps from high level to low level, voltages of the gates of the tenth and twelfth transistors M10, M12 are pulled up slightly due to parasitic capacitances. Because the gates of the tenth and twelfth transistors M10, M12 are connected to the first common node P1, the voltage of the first common node P1 should also be pulled up slightly. The gates of the fourth and sixth transistors M4, M6 are also connected to the first common node P1; therefore voltages of the gates of the fourth and sixth transistors M4, M6 should also be pulled up slightly. However, voltages of the drains of the fourth and sixth transistors M4, M6 are pulled down if the voltages of the gates of the fourth and sixth transistors M4, M6 are pulled up, and the voltages of gates of the fourth and sixth transistors M4, M6 are pulled down due to parasitic capacitances thereof. Thus, the voltage of the first common node P1 is able to remain substantially stable.

Figure 4:
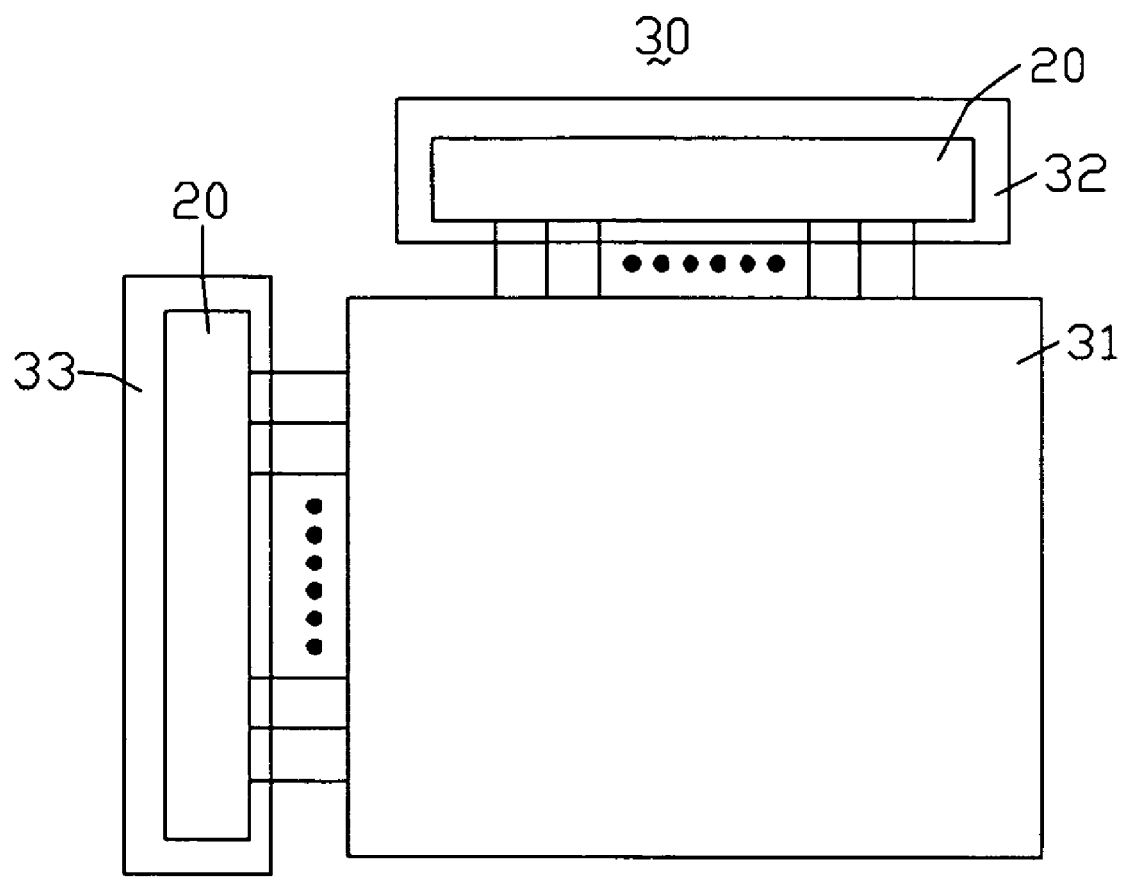
FIG. 4 is an abbreviated block diagram of an LCD including the shift register of FIG. 1.
Figure 5:
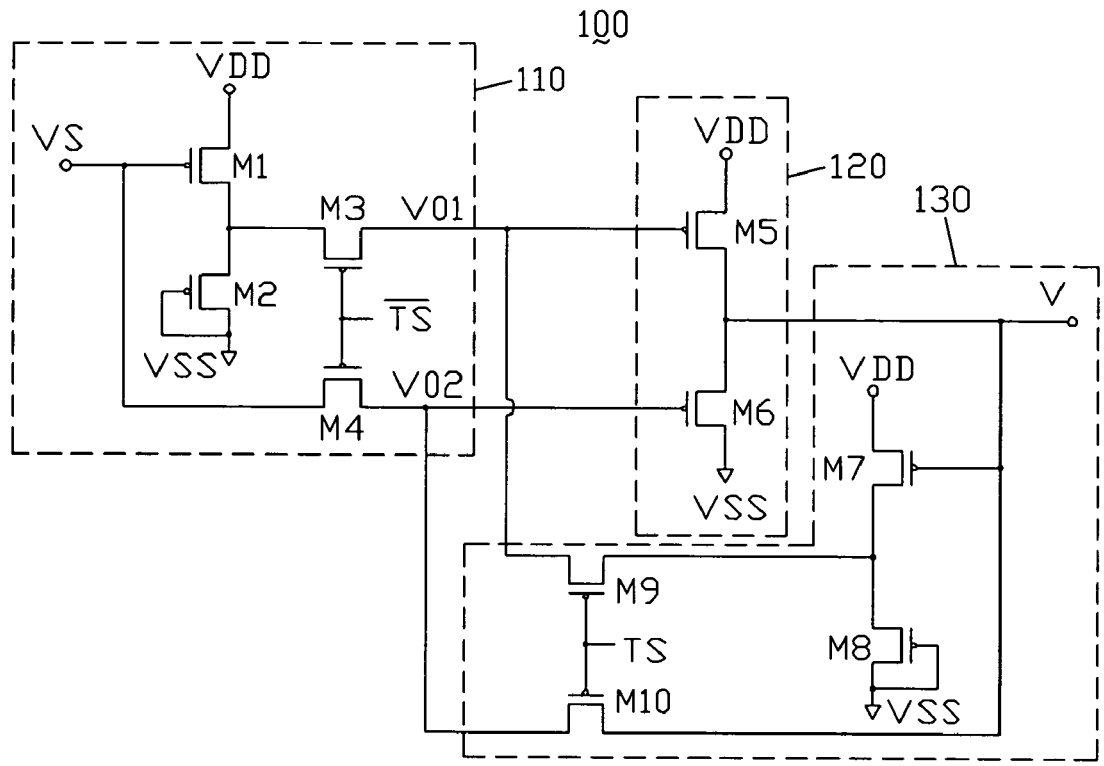
FIG. 5 is a circuit diagram of a shift register unit of a conventional shift register.
Figure 6:
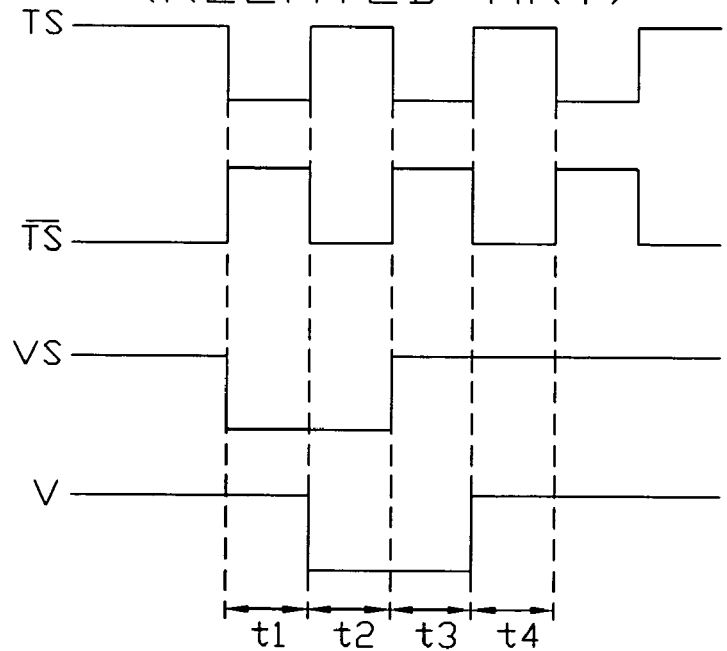
FIG. 6 is a sequence waveform diagram of pulse signals of the shift register of FIG. 5.

Referring to FIG. 4, a liquid crystal display 30 according to an exemplary embodiment of the present invention is shown. The liquid crystal display 30 includes a liquid crystal panel 31, a gate driving circuit 33, and a data driving circuit 32. The data driving circuit 32 and the gate driving circuit 33 each include at least one shift register 20. Each shift register 20 provides a plurality of shift register signals sequentially to the liquid crystal panel 31.

It is to be further understood that even though numerous characteristics and advantages of the present embodiments have been set out in the foregoing description, together with details of the structures and functions of the embodiments, the disclosure is illustrative only, and that changes may be made in detail, especially in matters of shape, size, and arrangement of parts within the principles of the invention to the full extent indicated by the broad general meaning of the terms in which the appended claims are expressed.

What is claimed is:

1. A shift register for providing a plurality of shift register signals, the shift register comprising:
   a plurality of shift register units, each shift register unit being provided with one of a first clock signal and a second clock signal, a high-level voltage, and a low-level voltage, each two adjacent shift register units receiving the first and second clock signal respectively, each shift register unit comprising:
      a signal outputting circuit comprising:
         a clock unit comprising a first output, the clock unit being configured for receiving one of the first and second clock signals from an external circuit and applying a shift register signal to the first output; and
         a level unit configured for receiving and applying the low-level voltage to the first output;
      a signal inputting circuit configured for switching on the clock unit upon receiving a shift register signal from a previous adjacent one of the shift register units, and switching off the clock unit upon receiving a shift register signal from a next adjacent one of the shift register units;
      a first inversion circuit configured for switching off the level unit when the clock unit is switched on; and
      a second inversion circuit configured for switching on the level unit upon receiving the shift register signal of the next adjacent one of the shift register units;
   wherein when the clock unit is switched on, the signal outputting circuit outputs the shift register signal;
   wherein when the clock unit is switched off, the level unit is switched on by the second inversion circuit and the signal outputting circuit outputs a low-level signal
   wherein the signal inputting circuit, the first inversion circuit, and the signal outputting circuit are connected to a first common node which is connected to the clock unit, and the second inversion circuit, the third inversion circuit and the signal outputting circuit are connected to a second common node which is connected to the level unit;
   wherein the signal inputting circuit comprises a first transistor and a second transistor, a gate of the first transistor being applied with the shift register signal of the previous adjacent one of the shift register units, a source of the first transistor being applied with the high-level voltage from the external circuit, a drain of the first transistor being connected a source of the second transistor and further connected to the first common node, a gate of the second transistor being applied with the shift register signal of the next adjacent one of the shift register units, a drain of the second transistor being applied with the low-level voltage, except in the case of the shift register unit being a first one of the shift register units wherein in such case the gate of the first transistor is coupled to the corresponding external circuit;
   wherein the first inversion circuit comprises a third transistor, a fourth transistor, a fifth transistor, and a sixth transistor, a gate of the third transistor being applied with one of the first and second clock signals, a source of the third transistor being connected to a drain of the fourth transistor, a drain of the third transistor being applied with the high-level voltage, a gate of the fourth transistor being connected to the first common node, a source being applied with the low-level voltage, the drain of the fourth transistor being further connected to a gate of the fifth transistor, a source of the fifth transistor being connected to a drain of the sixth transistor, a drain of the fifth transistor being applied with high-level voltage, a gate of the sixth transistor being connected to the gate of the fourth transistor, and a source of the sixth transistor being applied with the low-level voltage.

2. The shift register in claim 1, wherein the second inversion circuit comprises a seventh transistor, a gate of the seventh transistor being connected to a first output of the next adjacent one of the shift register units, a source of the seventh transistor being connected to the second common node, a drain of the seventh transistor being applied with the high-level voltage.

3. The shift register in claim 2, further comprising a third inversion circuit, the third inversion circuit comprising an eighth transistor and a ninth transistor, a gate of the eighth transistor being connected to the second common node, a source of the eighth transistor being connected to a drain of the ninth transistor, a drain of the eighth transistor being connected to the first common node, a source of the ninth transistor being applied with the low-level voltage, a gate of the ninth transistor being connected to a second common node of the previous adjacent one of the shift register units except in the case of the shift register unit being the first shift register unit wherein in such case the gate of the ninth transistor is floating.

4. The shift register in claim 3, wherein the clock unit comprises a tenth transistor and a twelfth transistor, the level unit comprises a eleventh transistor and a thirteenth transistor, gates of the tenth and twelfth transistors being connected to the first common node, sources of the tenth and twelfth transistors being connected to drains of the eleventh and thirteenth transistors respectively and being connected to the first output, drains of the tenth and twelfth transistors being applied with one of the first and second clock signals, gates of the eleventh and thirteenth transistors being connected to the second common node, sources of the eleventh and thirteenth transistors being applied with the low-level voltage.

5. The shift register in claim 4, wherein the first, second, third, fourth, fifth, sixth, seventh, eighth, ninth, tenth, eleventh, twelfth, and thirteenth transistors are N-channel metal oxide semiconductor transistors.

6. The shift register in claim 1, wherein the first and second clock signals being identical in amplitude, duty ratio, and frequency, but are inverse in phase relative to each other.

7. The shift register in claim 1, wherein a duty ratio of each of the first and second clock signals is equal to 50%.

8. A liquid crystal display comprising:
a liquid crystal panel;
a gate driving circuit; and
a data driving circuit;
wherein each of the gate driving circuit and the data driving circuit comprises at least one shift register, the at least one shift register comprising a plurality of shift register units, each shift register unit being provided with one of a first clock signal and a second clock signal, a high-level voltage, and a low-level voltage, each two adjacent shift register units receiving the first and second clock signal respectively, each shift register unit comprising:
a signal outputting circuit comprising:
a clock unit comprising a first output, the clock unit being configured for receiving one of the first and second clock signals from an external circuit and applying a shift register signal to the first output; and
a level unit configured for receiving and applying the low-level voltage to the first output;
a signal inputting circuit configured for switching on the clock unit upon receiving a shift register signal from a previous adjacent one of the shift register units, and switching off the clock unit upon receiving a shift register signal from a next adjacent one of the shift register units;
a first inversion circuit configured for switching off the level unit when the clock unit is switched on; and
a second inversion circuit configured for switching the level unit upon receiving the shift register signal of the next adjacent one of the shift register units;
wherein when the clock unit is switched on, the signal outputting circuit outputs the shift register signal; and
wherein when the clock unit is switched off, the level unit is switched on by the second inversion circuit and the signal outputting circuit outputs a low-level signal;
wherein the signal inputting circuit, the first inversion circuit, and the signal outputting circuit are connected to a first common node which is connected to the first output, and the second inversion circuit, the third inversion circuit and the signal outputting circuit are connected to a second common node which is connected to the level unit;
wherein the signal inputting circuit comprises a first transistor and a second transistor, a gate of the first transistor being applied with the shift register signal of the previous adjacent one of the shift register units, a source of the first transistor being applied with the high-level voltage from the external circuit, a drain of the first transistor being connected a source of the second transistor and further connected to the first common node, a gate of the second transistor being applied with the shift register signal of the next adjacent one of the shift register units, a drain of the second transistor being applied with the low-level voltage, except in the case of the shift register unit being the first one of the shift register units wherein in such case the gate of the first transistor is coupled to the corresponding external circuit;
wherein the first inversion circuit comprises a third transistor, a fourth transistor, a fifth transistor, and a sixth transistor, a gate of the third transistor being applied with one of the first and second clock signals, a source of the third transistor being connected to a drain of the fourth transistor, a drain of the third transistor being applied with the high-level voltage, a gate of the fourth transistor being connected to the first common node, a source being applied with the low-level voltage, the drain of the fourth transistor being further connected to a gate of the fifth transistor, a source of the fifth transistor being connected to a drain of the sixth transistor, a drain of the fifth transistor being applied with high-level voltage, a gate of the sixth transistor being connected to the gate of the fourth transistor, and a source of the sixth transistor being applied with the low-level voltage.

9. The liquid crystal display in claim 8, wherein the second inversion circuit comprises a seventh transistor, a gate of the seventh transistor being connected to a first output of the next adjacent one of the shift register units, a source of the seventh transistor being connected to the second common node, a drain of the seventh transistor being applied with the high-level voltage.

10. The liquid crystal display in claim 9, wherein the shift register further comprises a third inversion circuit, the third inversion circuit comprising an eighth transistor and a ninth transistor, a gate of the eighth transistor being connected to the second common node, a source of the eighth transistor being connected to a drain of the ninth transistor, a drain of the eighth transistor being connected to the first common node, a source of the ninth transistor being applied with the low-level voltage, a gate of the ninth transistor being connected to a second common node of the previous shift register unit except in the case of the shift register unit being the first shift register unit wherein in such case the gate of the ninth transistor is floating.

11. The liquid crystal display in claim 10, wherein the clock unit comprises a tenth transistor and a twelfth transistor, the level unit comprises a eleventh transistor and a thirteenth transistor, gates of the tenth and twelfth transistors being connected to the first common node, sources of the tenth and twelfth transistors being connected to drains of the eleventh and thirteenth transistors respectively and being connected to the first output, drains of the tenth and twelfth transistors being applied with one of the first and second clock signals, gates of the eleventh and thirteenth transistors being connected to the second common node, sources of the eleventh and thirteenth transistors being applied with the low-level voltage.

12. The liquid crystal display in claim 11, wherein the first, second, third, fourth, fifth, sixth, seventh, eighth, ninth, tenth, eleventh, twelfth, and thirteenth transistors are N-channel metal oxide semiconductor transistors.

13. The liquid crystal display in claim 8, wherein the first and second clock signals being identical in amplitude, duty ratio, and frequency, but are inverse in phase relative to each other.

14. The liquid crystal display in claim 8, wherein a duty ratio of each of the first and second clock signals is equal to 50%.

* * * * *